US010839927B1

(12) United States Patent
Cantarelli et al.

(10) Patent No.: US 10,839,927 B1
(45) Date of Patent: Nov. 17, 2020

(54) APPARATUS AND METHODS FOR MITIGATING PROGRAM DISTURB

(71) Applicant: MICRON TECHNOLOGY, INC., Boise, ID (US)

(72) Inventors: Daniele Cantarelli, Villasanta (IT); Augusto Benvenuti, Lallio (IT); Massimo Ernesto Bertuccio, San Donato Milanese (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/575,476

(22) Filed: Sep. 19, 2019

Related U.S. Application Data

(60) Provisional application No. 62/893,331, filed on Aug. 29, 2019.

(51) Int. Cl.
| | |
|---|---|
| *G11C 16/26* | (2006.01) |
| *G11C 16/04* | (2006.01) |
| *G11C 16/24* | (2006.01) |
| *G11C 16/34* | (2006.01) |
| *G11C 16/10* | (2006.01) |
| *G11C 11/56* | (2006.01) |
| *G11C 16/32* | (2006.01) |
| *G11C 7/12* | (2006.01) |

(52) U.S. Cl.
CPC ...... *G11C 16/3459* (2013.01); *G11C 11/5628* (2013.01); *G11C 11/5642* (2013.01); *G11C 11/5671* (2013.01); *G11C 16/0483* (2013.01); *G11C 16/10* (2013.01); *G11C 16/26* (2013.01); *G11C 16/32* (2013.01); *G11C 16/3427* (2013.01); *G11C 7/12* (2013.01); *G11C 16/04* (2013.01); *G11C 2211/5621* (2013.01)

(58) Field of Classification Search
CPC ........... G11C 16/3459; G11C 11/5628; G11C 11/5642; G11C 11/5671; G11C 16/0483; G11C 16/10; G11C 16/26; G11C 16/32; G11C 16/3427; G11C 2211/5621
USPC ........... 365/185.25, 185.18, 185.11, 185.22, 365/185.17
See application file for complete search history.

(56) References Cited

U.S. PATENT DOCUMENTS

| | | |
|---|---|---|
| 9,711,228 B1 | 7/2017 | Tanzawa |
| 9,947,418 B2 | 4/2018 | Helm et al. |
| 2016/0078958 A1* | 3/2016 | Wang ................. G11C 16/3459 365/185.11 |
| 2016/0267948 A1* | 9/2016 | Tanzawa ................. G11C 16/10 |
| 2018/0137922 A1* | 5/2018 | Sakui ................. H01L 27/11529 |
| 2020/0194084 A1* | 6/2020 | Russo ..................... G11C 7/04 |

\* cited by examiner

*Primary Examiner* — Ly D Pham
(74) *Attorney, Agent, or Firm* — Dicke, Billig & Czaja, PLLC

(57) ABSTRACT

Methods of operating a memory, and memory configured to perform similar methods, might include performing a sense operation on a particular memory cell of a string of series-connected memory cells, discharging the respective access line for a second memory cell of the string of series-connected memory cells to a first voltage level, discharging the respective access line for the particular memory cell to a second voltage level higher than the first voltage level, and discharging the respective access line for a third memory cell of the string of series-connected memory cells to a third voltage level lower than the second voltage level and higher than the first voltage level.

25 Claims, 10 Drawing Sheets

APPARATUS AND METHODS FOR MITIGATING PROGRAM DISTURB

RELATED APPLICATION

This application claims the benefit of U.S. Provisional Application No. 62/893,331, filed on Aug. 29, 2019, hereby incorporated herein in its entirety by reference.

TECHNICAL FIELD

The present disclosure relates generally to memory and, in particular, in one or more embodiments, the present disclosure relates to apparatus and methods for mitigating program disturb.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

Programming in memories is typically accomplished by applying a plurality of programming pulses, separated by program verify pulses, to program each memory cell of a selected group of memory cells to a respective intended data state (which may be an interim or final data state). With such a scheme, the programming pulses are applied to access lines, such as those typically referred to as word lines, for selected memory cells. After each programming pulse, one or more program verify pulses are used to verify the programming of the selected memory cells. Current programming typically uses many programming pulses in an incremental step pulse programming scheme, where each programming pulse is a single pulse that moves the memory cell threshold voltage by some amount.

DETAILED DESCRIPTION

Figure 1:
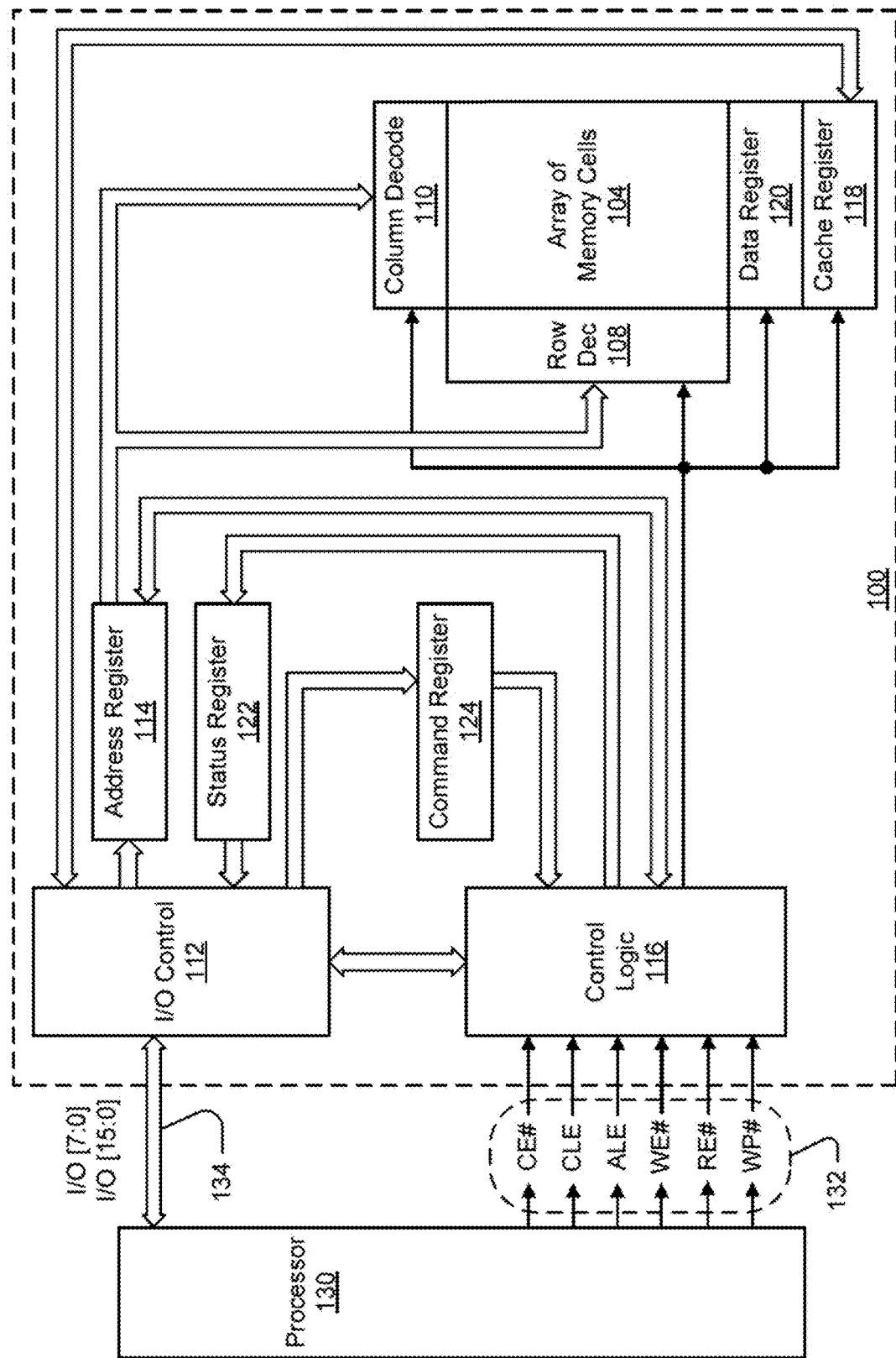
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The term conductive as used herein, as well as its various related forms, e.g., conduct, conductively, conducting, conduction, conductivity, etc., refers to electrically conductive unless otherwise apparent from the context. Similarly, the term connecting as used herein, as well as its various related forms, e.g., connect, connected, connection, etc., refers to electrically connecting unless otherwise apparent from the context.

It is recognized herein that even where values may be intended to be equal, variabilities and accuracies of industrial processing and operation may lead to differences from their intended values. These variabilities and accuracies will generally be dependent upon the technology utilized in fabrication and operation of the integrated circuit device. As such, if values are intended to be equal, those values are deemed to be equal regardless of their resulting values.

In three-dimensional memory arrays, e.g., three-dimensional NAND memory arrays, which may lack a body contact, the potential in the channel region might not be easily controlled, as it may be floating. Access operations, e.g., program verify operations, can leave the potentials in the channel region in an unstable state, often different from a reference potential, such as ground or 0V. This potential in the channel region can affect subsequent access operations, e.g., programming operations, producing undesirable changes to the data state of a memory cell not selected for programming, which is often referred to as disturb.

In particular, during a programming operation, an access line selected for the programming operation may be connected to memory cells selected for programming (e.g., selected memory cells) as well as memory cells not selected for programming (e.g., unselected victim memory cells). A victim memory cell, which may be exposed to the same voltages as a selected memory cell, may experience disturb from a subsequent programming pulse following a program verify operation if the voltage level of its channel region is too low. To reduce disturb to a victim memory cell following a program verify operation, the channel region might be boosted. However, if the boosting is too low, the victim memory cell can suffer parasitic programming sufficient to alter its intended data state. In addition, if the boosting is too high and localized, it can create a high electric field between the victim memory cell and its nearest neighbor memory cells. Such electric fields can generate electron-hole pairs, creating high energy free carriers (e.g., hot electrons) which, in turn, can also alter the intended data state of the victim memory cell. As memory storage densities (e.g., numbers of digits stored per memory cell) increase, these disturb effects may become more critical.

One method of boosting the channel region of a victim memory cell of a string of series-connected memory cells might include discharging all access lines and select lines for the string of series-connected memory cells to a reference potential following a program verify operation, then applying a pulse to a subset of select lines, e.g., drain-side select lines, and a subset of the access lines, e.g., drain-side access lines, to pre-charge the channel (often referred to as a "seeding operation") before a subsequent programming pulse. However, if memory cells connected to the pulsed subset of access lines within the same string of series-connected memory cells as the victim memory cell are already programmed, the effects of such seeding operations might be reduced or even eliminated. Various embodiments may facilitate mitigation of program disturb of a victim memory cell without utilizing such a seeding operation.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and generates status information for the external processor 130, i.e., control logic 116 is configured to perform access operations (e.g., read operations, programming operations and/or erase operations) on the array of memory cells 104. The control logic 116 may be configured to perform methods of various embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data may be passed from the cache register 118 to the data register 120 for transfer to the array of memory cells 104; then new data may be latched in the cache register 118 from the I/O control circuitry 112. During a read operation, data may be passed from the cache register 118 to the I/O control circuitry 112 for output to the external processor 130; then new data may be passed from the data register 120 to the cache register 118. The cache register 118 and/or the data register 120 may form (e.g., may form a portion of) a data buffer (e.g., page buffer) of the memory device 100. A data buffer may further include sensing devices (not shown in FIG. 1) to sense a data state of a memory cell of the array of memory cells 104, e.g., by sensing a state of a data line connected to that memory cell. A status register 122 may be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0] of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 120 for programming the array of memory cells 104. For another embodiment, cache register 118 may be omitted, and the data may be written directly into data register 120. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) may be used in the various embodiments.

Figure 2A:
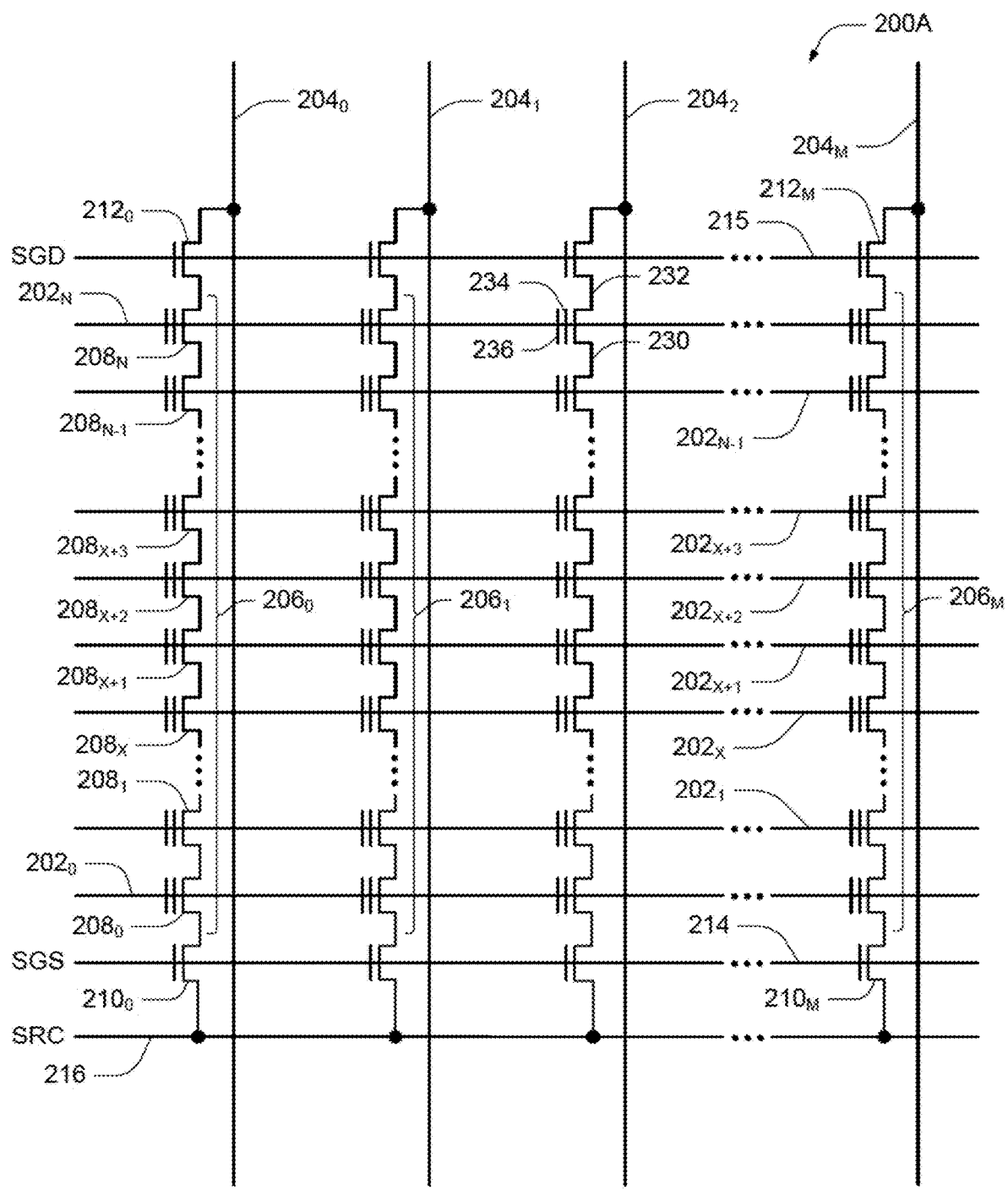
FIGS. 2A-2B are schematics of portions of an array of memory cells as could be used in a memory of the type described with reference to FIG. 1.

FIG. 2A is a schematic of a portion of an array of memory cells $200_A$, such as a NAND memory array, as could be used in a memory of the type described with reference to FIG. 1, e.g., as a portion of array of memory cells 104. Memory array $200_A$ includes access lines, such as word lines $202_0$ to $202_N$, and data lines, such as bit lines $204_0$ to $204_M$. The word lines 202 may be connected to global access lines (e.g., global word lines), not shown in FIG. 2A, in a many-to-one relationship. For some embodiments, memory array $200_A$ may be formed over a semiconductor that, for example, may be conductively doped to have a conductivity type, such as a p-type conductivity, e.g., to form a p-well, or an n-type conductivity, e.g., to form an n-well.

Memory array $200_A$ might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 may represent non-volatile memory cells for storage of data. Memory cells 208 may further represent non-volatile "dummy" memory cells. Dummy memory cells might be provided at the edges of the NAND strings 206, such as at word lines $202_0$ and $202_N$, and may act to reduce disturb effects on remaining memory cells 208 of the NAND strings 206, and to support connection to, or isolation from, the bit line 204 and/or the source 216. Dummy memory cells are typically not used to store data accessible to a user of the memory. There may be no intervening memory cells 208 between the edge word lines $202_0$ and $202_N$ and their nearest select gate 210 or 212, respectively.

The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells $200_A$ may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 2B:
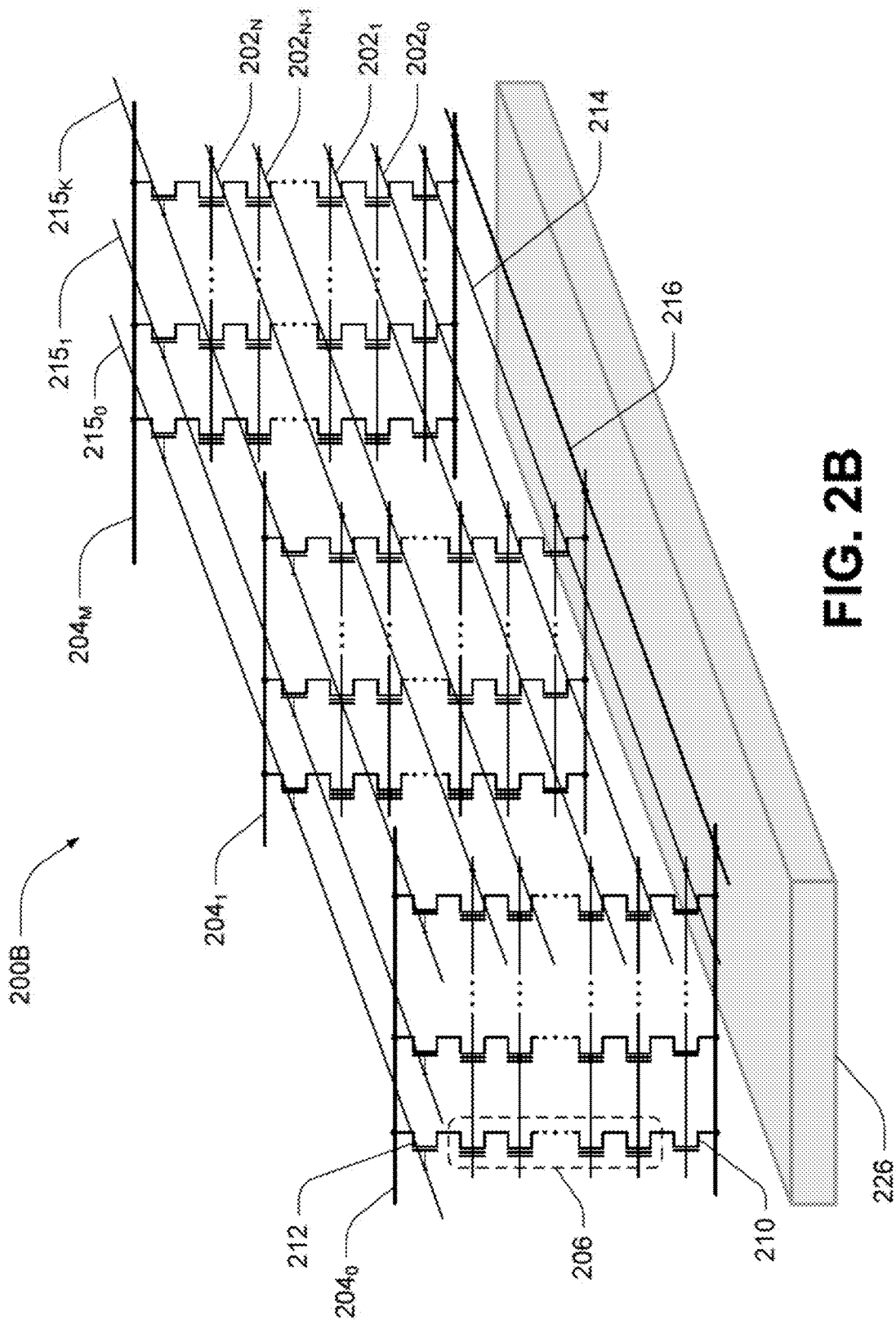

FIG. 2B is another schematic of a portion of an array of memory cells $200_B$ as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array $200_B$ may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 may be connected to multiple rows of memory cells of the memory array $200_B$. Rows of memory cells that are commonly connected to each other by a particular word line 202 may collectively be referred to as tiers.

The three-dimensional NAND memory array $200_B$ might be formed over peripheral circuitry 226. The peripheral circuitry 226 might represent a variety of circuitry for accessing the memory array $200_B$. The peripheral circuitry 226 might include string drivers (not shown in FIG. 2B) for connection to word lines 202 of the memory array $200_B$. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 3:
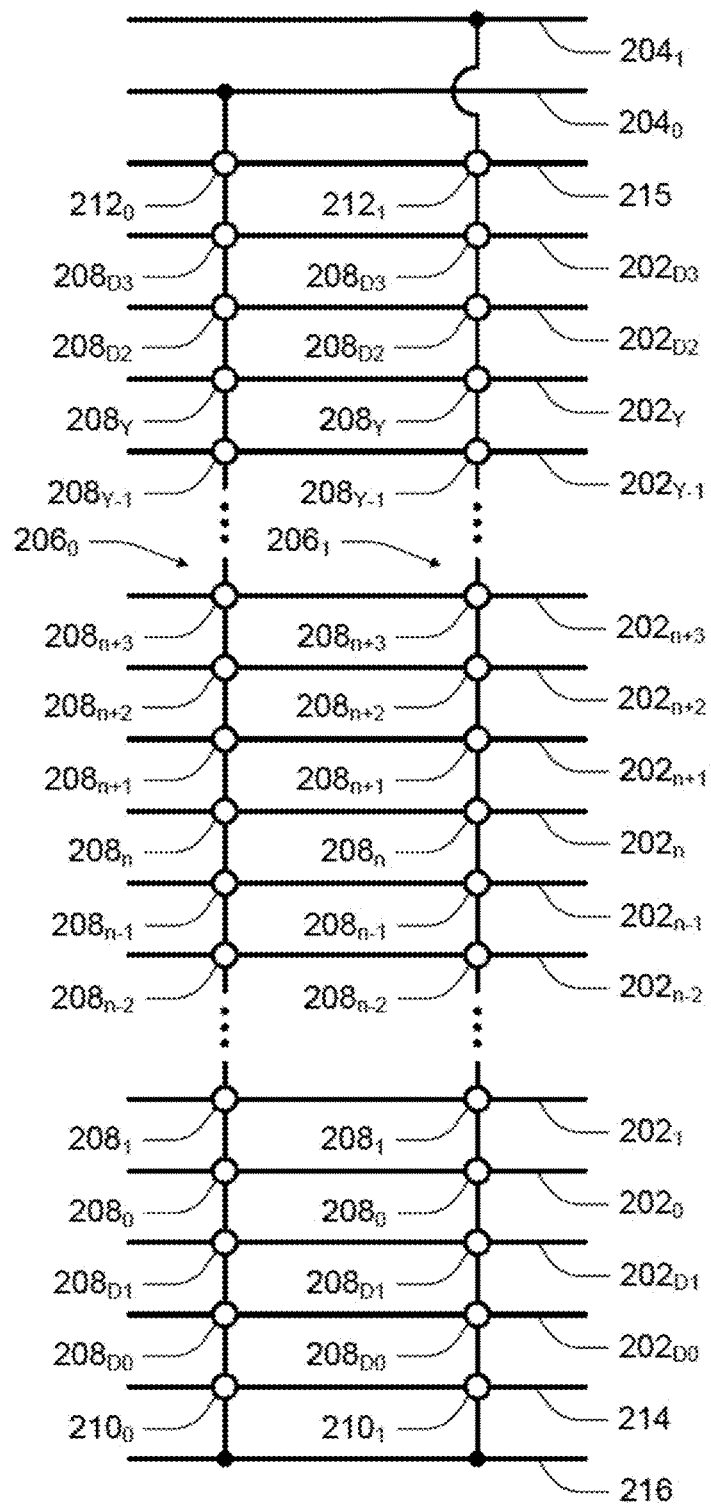
FIG. 3 conceptually depicts adjacent strings of series-connected memory cells for reference in describing methods of operating a memory in accordance with various embodiments.

FIG. 3 conceptually depicts adjacent strings of series-connected memory cells, e.g., NAND strings $206_0$ and $206_1$, for reference in describing methods of operating a memory in accordance with various embodiments. Like numbered elements in FIG. 3 correspond to the description as provided with respect to FIGS. 2A and 2B.

With reference to FIG. 3, NAND strings $206_0$ and $206_1$ are each depicted to include Y+1 memory cells 208 for storage of data, e.g., memory cells $208_0$-$208_Y$, connected to access lines $202_0$-$202_Y$, respectively. NAND strings $206_0$ and $206_1$ are each further depicted to include four memory cells 208 as dummy memory cells, e.g., dummy memory cells $208_{D0}$-$208_{D3}$, connected to access lines $202_{D0}$-$202_{D3}$, respectively. Although four dummy memory cells are depicted, with two at each end of a NAND string 206, other numbers of dummy memory cells might be used at each end of a NAND string 206, with each end independent of the other. Dummy memory cells at the end of a NAND string 206 may be referred to as edge dummy memory cells, such as source-side edge dummy memory cells $208_{D0}$-$208_{D1}$, and drain-side edge dummy memory cells $208_{D2}$-$208_{D3}$. In addition, it is known to further include dummy memory cells between memory cells used for storage of data. For example, dummy memory cells might be included in a NAND string 206 between memory cell $208_{n+3}$ and $208_{Y-1}$. Such dummy memory cells interposed among memory cells used for storage of data may be referred to as intermediate dummy memory cells. Furthermore, as noted with respect to FIG. 2A, the select gates 210 (e.g., select gates $210_0$ and $210_1$) and the select gates 212 (e.g., select gates $212_0$ and $212_1$) might each represent a respective plurality of select gates connected in series and receiving a same or independent control signal on a respective select line.

Figure 4:
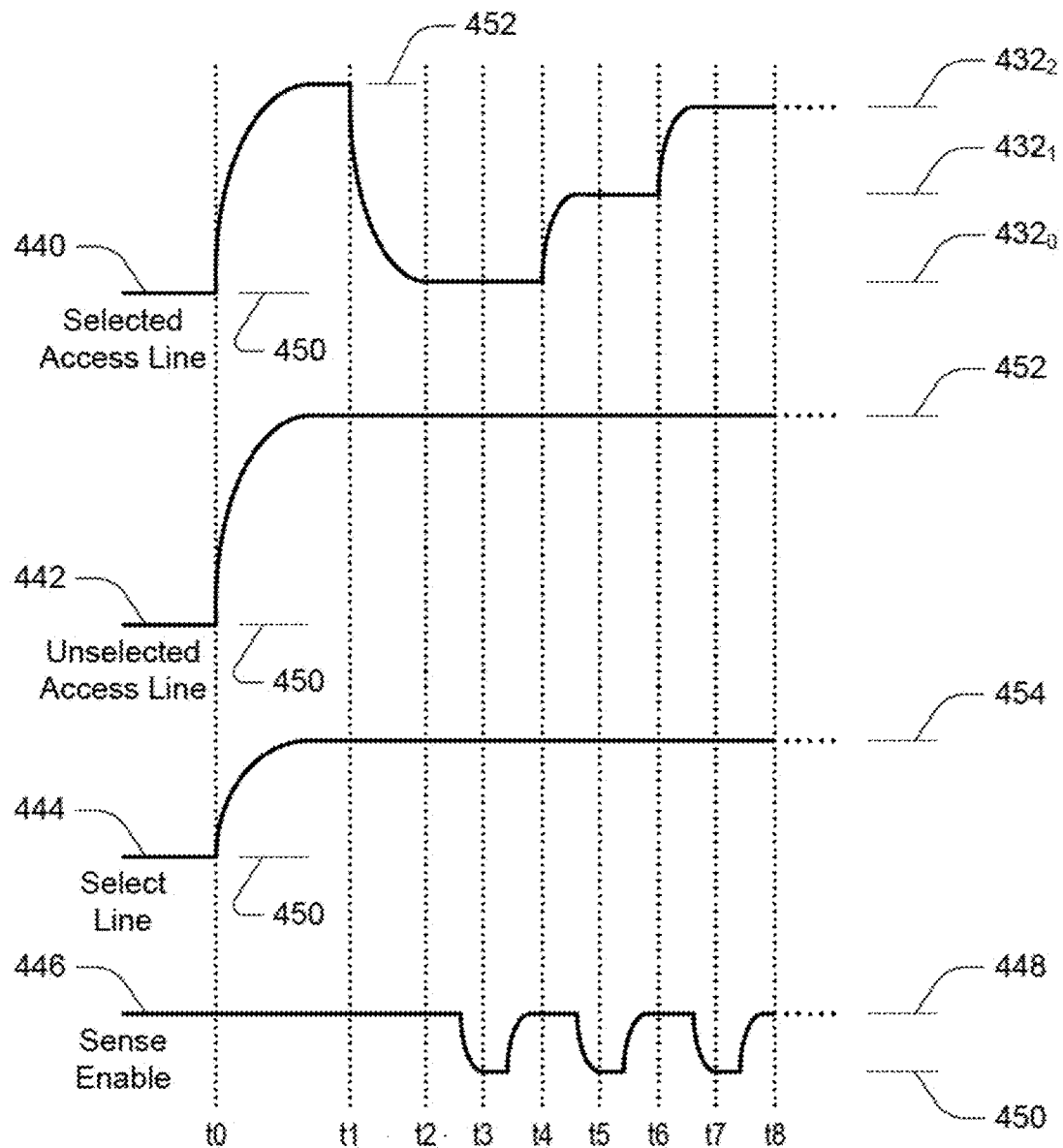
FIG. 4 depicts a timing diagram for a method of operating a memory for use with various embodiments.

FIG. 4 depicts a timing diagram for a method of operating a memory for use with various embodiments. FIG. 4 is provided to place methods of the various embodiments in context of what type of operations might be performed prior.

The timing diagram of FIG. 4 might represent a sense operation of a memory, e.g., a program verify operation following a programming pulse of a programming operation, e.g., as will be described with reference to FIG. 5. For simplicity, FIG. 4 will presume a sense operation for MLC memory cells, e.g., four-level memory cells representing data states L0, L1, L2 and L3 using four threshold voltage ranges, each representing a data state corresponding to a bit pattern of two digits. While discussed in reference to MLC memory cells, sense operations performed on higher storage density memory cells, e.g., TLC (eight data states) or QLC (sixteen data states) memory cells, are equally applicable. Table 1 provides one possible correspondence between data states and their corresponding logical data values for an MLC memory cell. Other assignments of data states to logical data values are known. Memory cells remaining in the lowest data state (e.g., the erased state or L0 data state), as used herein, will be deemed to be programmed to the lowest data state.

TABLE 1

| Data State | Logical Data Value |
|---|---|
| L0 | 11 |
| L1 | 01 |
| L2 | 00 |
| L3 | 10 |

In FIG. 4, trace 440 might represent the voltage level applied to an access line connected to a memory cell selected for the sense operation, e.g., a target memory cell. The following discussion will be made with reference to at least FIG. 3 and will presume that the memory cell selected for the sense operation is the memory cell $208_n$ of the NAND string $206_0$, such that trace 440 might represent the voltage level applied to access line $202_n$. The access line $202_n$ may be referred to as the selected access line as it contains the target memory cell, while remaining access lines 202 may be referred to as unselected access lines. The NAND string $206_0$ may be referred to as the selected string of series-connected memory cells as it contains the target memory cell. The NAND string $206_1$ may be referred to as an unselected string of series-connected memory cells as it may contain no memory cell for which the sense operation is being performed.

Trace 442 might represent the voltage level applied to one or more of the unselected access lines 202, e.g., access lines $202_{D0}$-$202_{D1}$, $202_0$-$202_{n-1}$, $202_{n+1}$-$202_Y$, and $202_{D2}$-$202_{D3}$. Trace 444 might represent the voltage level applied to the select line 214 and/or the voltage level applied to the select line 215. Trace 446 might represent a voltage level of a sense enable signal. It is recognized that the sense operation of FIG. 4 might have more than one target memory cell, and may include a memory cell 208 connected to the selected access line 202 for each NAND string 206 or some subset thereof.

At time t0, a precharge phase might begin. The precharge phase of the sense operation might bring the unselected access lines 202 to a voltage level sufficient to activate their respective connected memory cells regardless of their data states, e.g., a pass voltage. As shown in the example of FIG. 4, the voltage levels of all access lines 202 of the block of memory cells containing the target memory cell (e.g., one or more target memory cells) are initially brought up to a voltage level 452. The voltage level 452 may be sufficient to activate each memory cell connected to one of the access lines 202 regardless of their data state. As one example, voltage level 452 might be approximately 8V. Bringing all of the access lines 202 up together in this manner may facilitate improvements in speed to steady state of any access line 202 whose desired voltage level is the voltage level 452. The select line 214 and the select line 215 might be brought up to a voltage level 454 sufficient to activate their respective select gates. The sense enable signal might normally have a logic high level indicating that sensing is disabled, and might be transitioned to a logic low level to enable sensing. The logic high level of the sense enable signal might correspond to a voltage level 448, which might be a supply voltage, such as Vcc. The logic low level of the sense enable signal might correspond to a voltage level 450, which might be a reference potential, e.g., Vss, ground or 0V.

At or around time t1, the selected access line $202_n$ might be discharged to a voltage level $432_0$. The voltage level $432_0$ might represent a sense voltage (e.g., a verify voltage) intended to distinguish between possible data states of the target memory cell (e.g., during a program verify operation). For example, if the target memory cell is activated while the voltage level $432_0$ is applied to the access line $202_n$, and thus to the control gate of the target memory cell, it may be deemed to have a data state corresponding to a range of threshold voltages lower than or equal to the voltage level $432_0$. If the target memory cell is deactivated while the voltage level $432_0$ is applied to the access line $202_n$, it may be deemed to have a data state corresponding to a range of threshold voltages higher than the voltage level $432_0$. A sensing of a state of a data line to determine whether the target memory cell is activated might be performed (e.g., in response to the sense enable signal transitioning to a logic low level) at time t3 while the voltage level $432_0$ is being applied to the access line $202_n$, as is well understood in the art. As one example, the voltage level $432_0$ might correspond to a sense voltage intended to determine that the memory cell has the L0 data state if first activated in response to the voltage level $432_0$ after the precharge phase. Although the voltage level $432_0$ is depicted as being higher than the voltage level 450, one or more of the voltage levels $432_0$-$432_2$ might be negative voltage levels for some embodiments.

While the voltage level $432_0$ is being applied to the selected access line $202_n$ at time t2, the voltage level 452 might be applied to the unselected access lines $202_{D0}$-$202_{D1}$, $202_0$-$202_{n-1}$, $202_{n+1}$-$202_Y$, and $202_{D2}$-$202_{D3}$. The voltage level 452 might be sufficient to activate the memory cells connected to these unselected access lines regardless of their data state. In addition, while the voltage level $432_0$ is being applied to the selected access line $202_n$ at time t2, the voltage level 454 might be applied to the select line 214 and to the select line 215. The voltage level 454 might be sufficient to activate the select gates connected to these select lines. In this manner, current flow may be established through the NAND string 206 if the target memory cell is activated, thus permitting sensing of its data state. As one example, the voltage level 454 might be approximately 5V.

At time t4, the voltage level applied to the selected access line $202_n$ might be increased to the voltage level $432_1$ while voltage levels of the other traces 442 and 444 might be maintained. The voltage level $432_1$ might represent a different sense voltage intended to distinguish between different possible data states of the target memory cell. A sensing of a state of a data line to determine whether the target memory cell is activated might be performed at time t5 while the voltage level $432_1$ is being applied to the access line $202_n$, as is well understood in the art. As one example, the voltage level $432_1$ might correspond to a sense voltage intended to determine that the memory cell has the L1 data state if first activated in response to the voltage level $432_1$ after the precharge phase.

At time t6, the voltage level applied to the selected access line $202_n$ might be increased to the voltage level $432_2$ while voltage levels of the other traces 442 and 444 might be maintained. The voltage level $432_2$ might represent a different sense voltage intended to distinguish between different possible data states of the target memory cell. A sensing of a state of a data line to determine whether the target memory cell is activated might be performed at time t7 while the voltage level $432_2$ is being applied to the access line $202_n$, as is well understood in the art. As one example, the voltage level $432_2$ might correspond to a sense voltage intended to determine that the memory cell has the L2 data state if first activated in response to the voltage level $432_2$ after the precharge phase. Memory cells that do not activate in response to any of the sense voltages $432_0$-$432_2$ might be deemed to have the data state L3.

While only four sense voltages are depicted in FIG. 4, other numbers of sense voltages might be used. In general, Z sense voltages might be used to distinguish between each of Z+1 possible data states. At time t8, the access lines and select lines might be discharged in accordance with embodiments.

Figure 5:
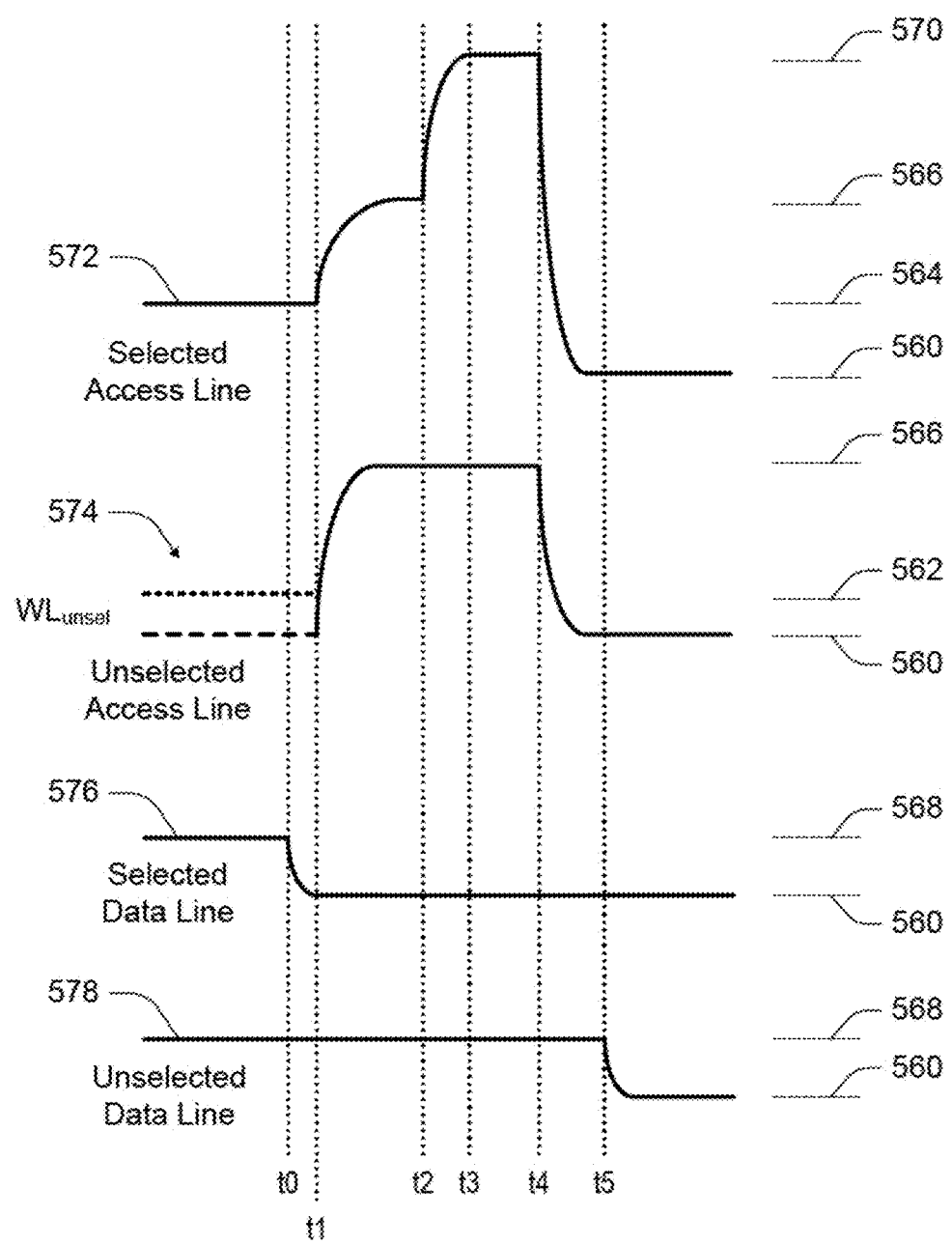
FIG. 5 depicts a timing diagram for a method of operating a memory for use with various embodiments.

FIG. 5 depicts a timing diagram for a method of operating a memory for use with various embodiments. For example, FIG. 5 may generally depict waveforms of various nodes of an array of memory cells at various stages of a programming operation in accordance with an embodiment.

In FIG. 5, trace 572 might represent the voltage level applied to an access line connected to a memory cell selected for the programming operation, e.g., a target memory cell selected for programming during the programming operation, while trace 574 might represent the voltage level applied to a different access line (e.g., an unselected access line) of a string of series-connected memory cells containing a memory cell selected for programming during the programming operation. The following discussion will be made with reference to at least FIG. 3 and will presume that the memory cell selected for the programming operation is the memory cell $208_n$ of the NAND string $206_0$, such that trace 572 might represent the voltage level applied to access line $202_n$, and trace 574 might represent the voltage level applied to one or more of the unselected access lines 202, e.g., access lines $202_{D0}$-$202_{D1}$, $202_0$-$202_{n-1}$, $202_{n+1}$-$202_Y$, and $202_{D2}$-$202_{D3}$.

Trace 576 might represent the voltage level applied to a data line (e.g., a selected data line) selectively connected to a memory cell selected for programming during the programming operation, e.g., trace 576 might represent the voltage level applied to data line $204_0$. Trace 578 might represent the voltage level applied to a data line (e.g., an unselected data line) selectively connected to a memory cell connected to the selected access line that is not selected for programming during the programming operation, e.g., trace 578 might represent the voltage level applied to data line $204_1$.

Prior to time t0, trace 574 might have an initial voltage level 560, such as a reference potential, ground or Vss. Alternatively, or in addition, unselected access lines of trace 574 might have an initial voltage level 562, higher than the voltage level 560. Traces 576 and 578 might each have an initial voltage level 568 acting as an inhibit voltage, such as Vcc. The voltage level 568 might be configured to inhibit programming of a memory cell connected to the selected access line 202 and selectively connected to a data line 204 receiving the voltage level 568. Further at time t0, trace 576 might be decreased to the voltage level 560, which might correspond to an enable voltage configured to enable programming of a memory cell connected to the selected access line 202 and selectively connected to a data line 204 receiving the voltage level 560.

At time t1, the traces 572 and 574 might be increased to a voltage level 566. The voltage level 566 might correspond to a pass voltage configured to activate a memory cell connected to an access line 202 regardless of its data state. At time t2, trace 572 might be increased to a voltage level 570. The voltage level 570 might correspond to a programming voltage configured to cause a change (e.g., increase) in a threshold voltage of a memory cell connected to the selected access line and selectively connected to a selected data line receiving an enable voltage. At time t3, trace 572 might be maintained at the voltage level 570 for a time period sufficient to effect the change in threshold voltage. The portion of trace 572 between time t3 and time t4 might be referred to as a programming pulse of the programming operation. At time t4, trace 572 might be discharged to the voltage level 560. Trace 574 might also be discharged to the voltage level 560. At time t5, trace 578 might also be discharged to the voltage level 560. Following time t5, a program verify operation, e.g., as described with reference to FIG. 4, might be performed.

Figure 6:
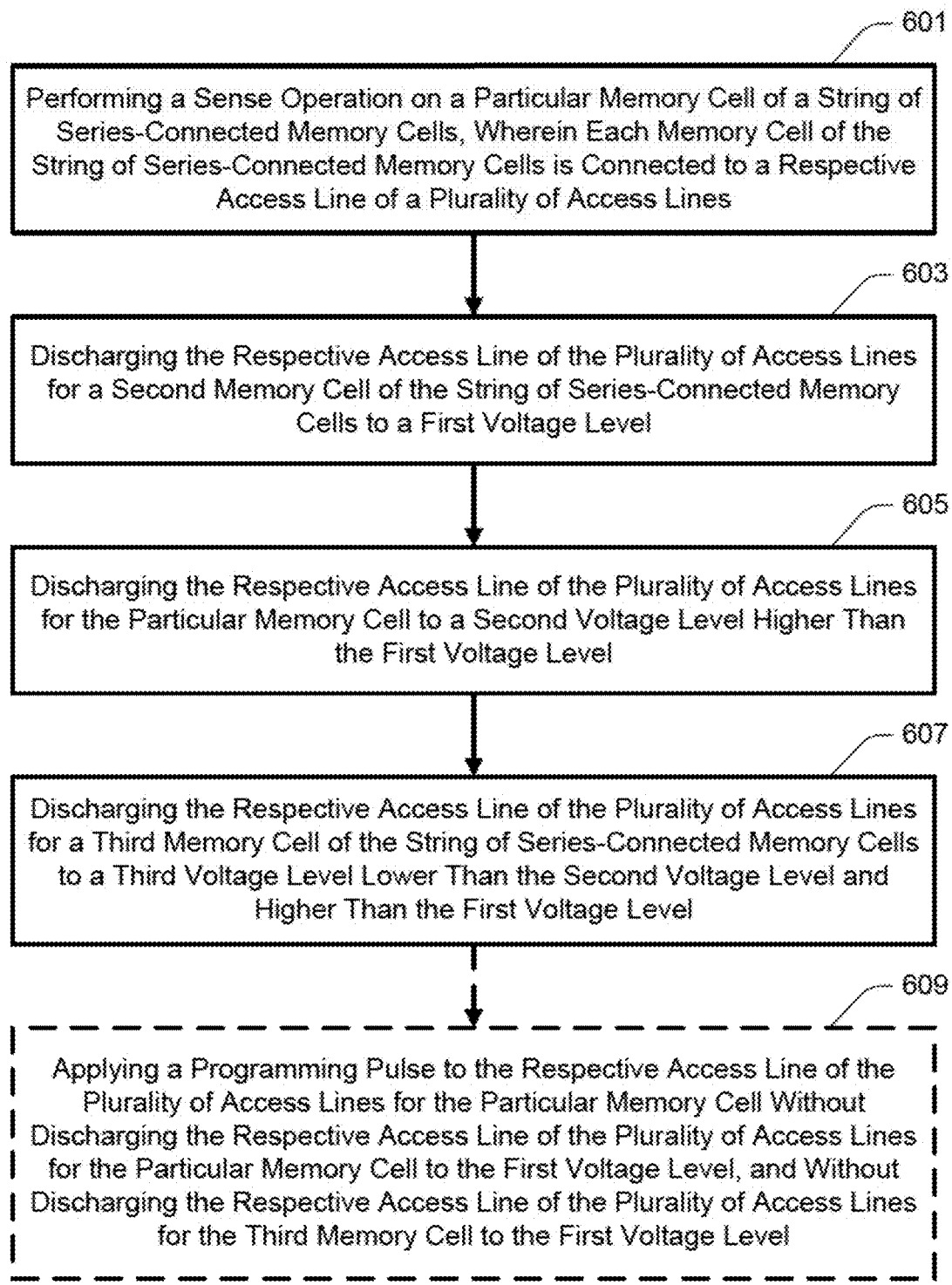
FIG. 6 is a flowchart of a method of operating a memory in accordance with an embodiment.

Various embodiments seek to discharge access lines to various voltage levels to facilitate a retention of electrons in channel regions of victim memory cells, e.g., following a program verify operation, and prior to a subsequent programming pulse. FIG. 6 is a flowchart of a method of operating a memory in accordance with an embodiment.

At 601, a sense operation might be performed on a particular memory cell (e.g., a selected or target memory cell) of a string of series-connected memory cells, wherein each memory cell of the string of series-connected memory cells is connected to a respective access line of a plurality of access lines. For example, with reference to FIG. 3, the particular memory cell might be memory cell $208_n$ of the NAND string $206_0$ connected to access line $202_n$. The sense operation might be a program verify operation, e.g., as described with reference to FIG. 3.

At 603, e.g., following completion of the sense operation, the respective access line of the plurality of access lines for a second memory cell (e.g., an unselected memory cell) of the string of series-connected memory cells might be discharged to a first voltage level. For example, the first voltage level might be the reference potential. As a further example, the second memory cell might be any one of the memory cells 208 between the particular memory cell and a first end (e.g., source-side or end nearest a source 216) of the NAND string $206_0$, e.g., any one of memory cells $208_0$-$208_{n-1}$ of the NAND string $206_0$ connected respectively to access lines $202_0$-$202_{n-1}$. The discharging at 603 might begin from a voltage level used for the sense operation. Alternatively, the discharging at 603 might begin from an intermediate voltage level, such as a voltage level between the voltage level used for the sense operation and the first voltage level.

At 605, the respective access line of the plurality of access lines for the particular memory cell might be discharged to a second voltage level higher than the first voltage level. For example, the second voltage level might be a voltage level between a voltage level following a program verify operation and the first voltage level. As one example, the second voltage level might be 3V. As a further example, the second voltage level might be higher than an average of a program verify voltage used during the sense operation and the reference potential.

The discharging at 605 might begin at a time when the discharging at 603 began. Alternatively, the discharging at 605 might begin at a time subsequent to a time when the discharging at 603 began. The discharging at 605 might further begin at a time prior to a time when the discharging at 603 reaches the first voltage level. The discharging at 605 might begin from a voltage level used for the sense operation. Alternatively, the discharging at 605 might begin from an intermediate voltage level, such as a voltage level between the voltage level used for the sense operation and the second voltage level.

At 607, the respective access line of the plurality of access lines for a third memory cell (e.g., an unselected memory cell) of the string of series-connected memory cells might be discharged to a third voltage level lower than the second voltage level and higher than the first voltage level. As one example, the third voltage level might be 2V. As a further example, the third voltage level might be lower than an average of a program verify voltage used during the sense operation and the reference potential. The third memory cell might be any memory cell 208 of one or more of the memory cells 208 adjacent to (e.g., immediately adjacent to) the particular memory cell and between the particular memory cell and a second end (e.g., drain-side or end nearest a data line 204) of the NAND string 206$_0$, e.g., one or more of memory cells 208$_{n+1}$ or higher of the NAND string 206$_0$ connected respectively to access lines 202$_{n+1}$ or higher.

The discharging at 607 might begin at a time when the discharging at 603 began. Alternatively, the discharging at 607 might begin at a time subsequent to a time when the discharging at 605 began. The discharging at 607 might further begin at a time prior to a time when the discharging at 605 reaches the second voltage level. The discharging at 607 might begin from a voltage level used for the sense operation. Alternatively, the discharging at 607 might begin from an intermediate voltage level, such as a voltage level between the voltage level used for the sense operation and the third voltage level.

At 609, a programming pulse might optionally be applied to the respective access line of the plurality of access lines for the particular memory cell without discharging the respective access line of the plurality of access lines for the particular memory cell to the first voltage level and without discharging the respective access line of the plurality of access lines for the third memory cell to the first voltage level. For example, the voltage level of the respective access line for the particular memory cell might be increased to the pass voltage directly from the second voltage level, while the voltage level of the respective access line for the third memory cell might be increased to the pass voltage directly from the third voltage level.

Discharging one or more access lines between the particular memory cell and one end of its string of series-connected memory cells to the first voltage level, discharging the access line connected to the particular memory cell to a second voltage level higher than the first voltage level, and discharging one or more access lines between the particular memory cell and the other end of its string of series-connected memory cells to a third voltage level lower than the second voltage level and higher than the first voltage level, might facilitate retention of electrons in a channel region of a victim memory cell connected to the same access line as the particular memory cell. This might facilitate mitigation of program disturb of the victim memory cell during a subsequent programming pules by mitigating a peak of boosting that might cause hot-electron generation, and further facilitating control of the strength of such local boosting.

For some embodiments, additional access lines between the particular memory cell and the other end of its string of series-connected memory cells might be discharged to voltage levels other than the third voltage level, but also lower than the second voltage level and higher than the first voltage level.

Figure 7A:
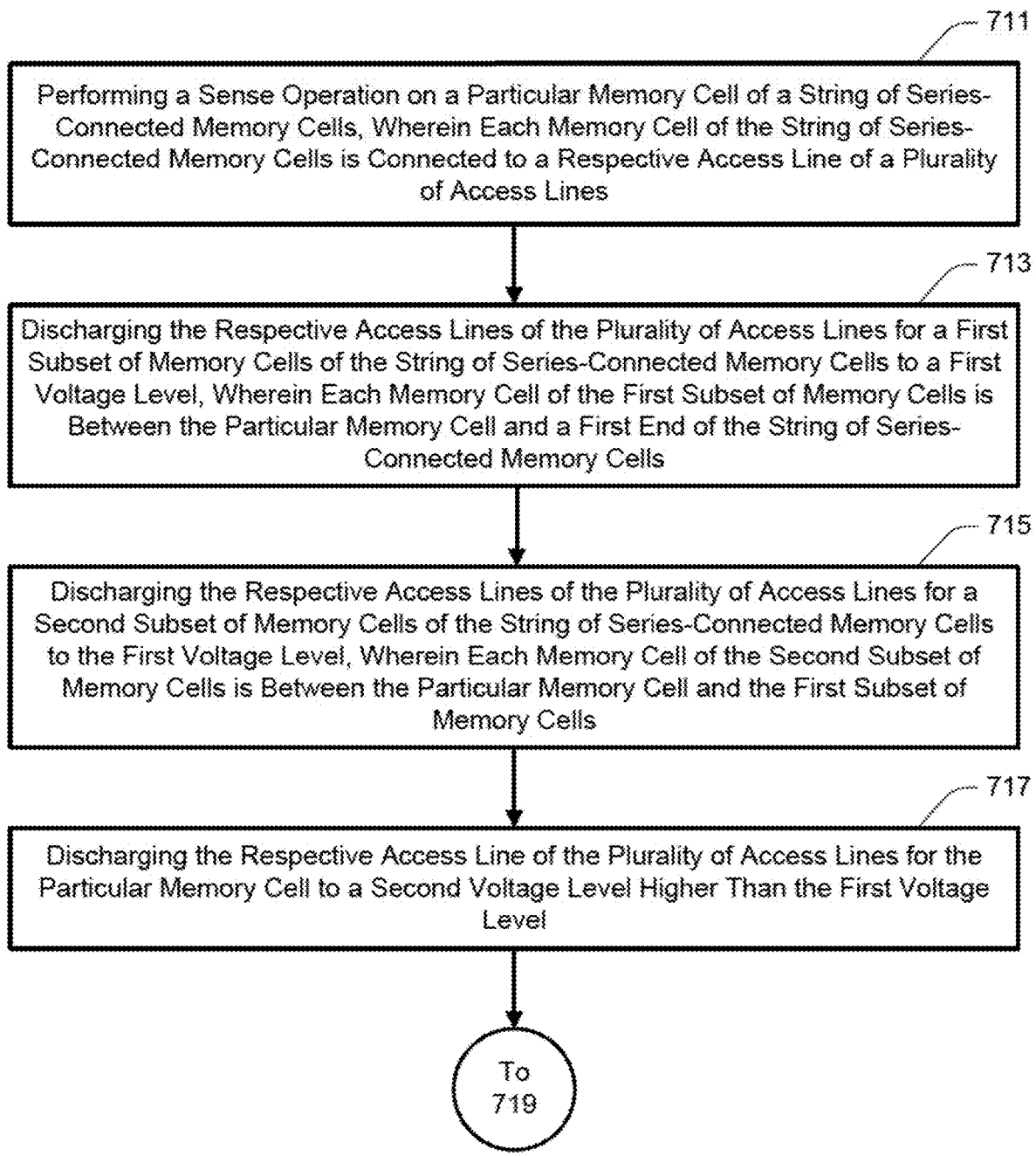
FIGS. 7A-7B are flowcharts of a method of operating a memory in accordance with another embodiment.
Figure 7B:
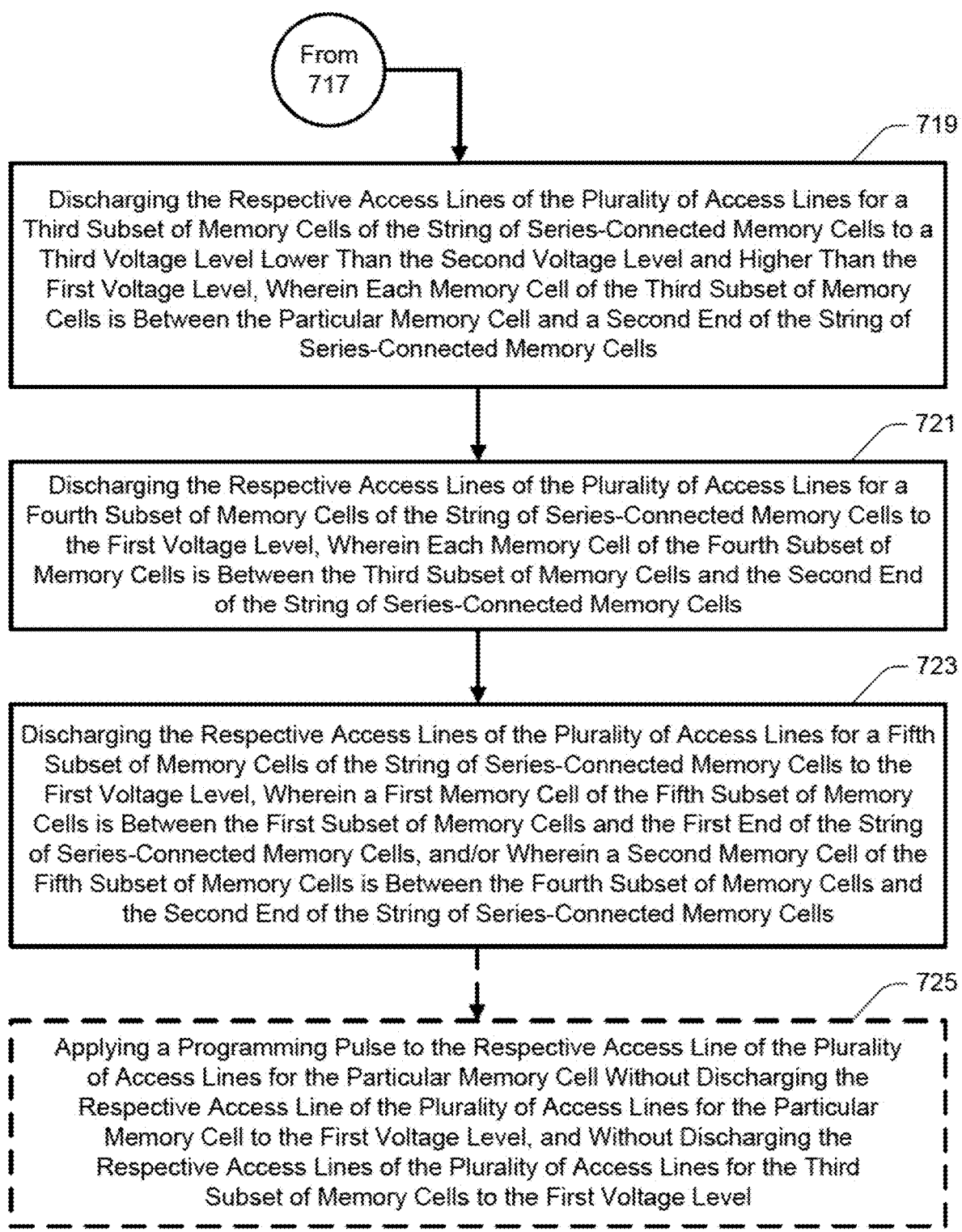

FIGS. 7A-7B are flowcharts of a method of operating a memory in accordance with another embodiment. At 711, a sense operation might be performed on a particular memory cell (e.g., a selected or target memory cell) of a string of series-connected memory cells, wherein each memory cell of the string of series-connected memory cells is connected to a respective access line of a plurality of access lines. For example, with reference to FIG. 3, the particular memory cell might be memory cell 208$_n$ of the NAND string 206$_0$ connected to access line 202$_n$. The sense operation might be a program verify operation, e.g., as described with reference to FIG. 3.

At 713, e.g., following completion of the sense operation, the respective access lines of the plurality of access lines for a first subset of memory cells (e.g., unselected memory cells) of the string of series-connected memory cells might be discharged to a first voltage level. The first voltage level might be the reference potential, for example. Each memory cell of the first subset of memory cells might be between the particular memory cell and a first end of the string of series-connected memory cells. The first subset of memory cells might be a contiguous plurality of memory cells.

As an example, the first subset of memory cells (e.g., unselected memory cells) might be a plurality of the memory cells 208 between the particular memory cell and a dummy memory cell nearest a first end (e.g., source-side or end nearest a source 216) of the NAND string 206$_0$, e.g., the memory cells 208$_0$-208$_{n-2}$ of the NAND string 206$_0$ connected respectively to access lines 202$_0$-202$_{n-2}$. The discharging at 713 might begin from a voltage level used for the sense operation, e.g., a pass voltage. Alternatively, the discharging at 713 might begin from an intermediate voltage level, such as a voltage level between the voltage level used for the sense operation and the first voltage level.

At 715, the respective access lines of the plurality of access lines for a second subset of memory cells (e.g., unselected memory cells) of the string of series-connected memory cells might be discharged to the first voltage level. Each memory cell of the second subset of memory cells might be between the particular memory cell and the first subset of memory cells. For example, the second subset of memory cells might be one or more of the memory cells 208 between the particular memory cell and the first subset of memory cells, e.g., the memory cell 208$_{n-1}$ of the NAND string 206$_0$ connected to access line 202$_{n-1}$. The second subset of memory cells might be a contiguous plurality of memory cells.

The discharging at 715 might begin at a time subsequent to a time when the discharging at 713 began. The discharging at 715 might further begin at a time prior to a time when the discharging at 713 reaches the first voltage level. The discharging at 715 might begin from a voltage level used for the sense operation, e.g., a pass voltage. Alternatively, the discharging at 713 might begin from an intermediate voltage level, such as a voltage level between the voltage level used for the sense operation and the first voltage level.

At 717, the respective access lines of the plurality of access lines for the particular memory cell might be discharged to a second voltage level higher than the first voltage level. For example, the second voltage level might be a voltage level between a voltage level following a program verify operation (or the intermediate voltage) and the first voltage level. As one example, the second voltage level might be 3V.

The discharging at 717 might begin at a time subsequent to a time when the discharging at 715 began. The discharging at 717 might further begin at a time prior to a time when the discharging at 715 reaches the first voltage level. The discharging at 717 might begin from a voltage level used for the sense operation, e.g., a program verify voltage. Alternatively, the discharging at 717 might begin from an intermediate voltage level, such as a voltage level between the voltage level used for the sense operation and the second voltage level.

At 719, the respective access lines of the plurality of access lines for a third subset of memory cells (e.g., unselected memory cells) of the string of series-connected memory cells might be discharged to a third voltage level lower than the second voltage level and higher than the first voltage level. Each memory cell of the third subset of memory cells might be between the particular memory cell and a second end (e.g., drain-side or end nearest a data line 204) of the NAND string $206_0$, e.g., one or more of the memory cells $208_{n+1}$ or higher of the NAND string $206_0$ connected respectively to access lines $202_{n+1}$ or higher. The third subset of memory cells might be adjacent to (e.g., immediately adjacent to) the particular memory cell. For example, the third subset of memory cells might be one or more of the memory cells 208 between the particular memory cell and the second end of the NAND string $206_0$, e.g., the memory cells $208_{n+1}$-$208_{n+2}$ of the NAND string $206_0$ connected to access lines $202_{n+1}$-$202_{n+2}$. The third subset of memory cells might be a contiguous plurality of memory cells.

The discharging at 719 might begin at a time subsequent to a time when the discharging at 717 began. The discharging at 719 might further begin at a time prior to a time when the discharging at 717 reaches the second voltage level. The discharging at 719 might begin from a voltage level used for the sense operation, e.g., a pass voltage. Alternatively, the discharging at 719 might begin from an intermediate voltage level, such as a voltage level between the voltage level used for the sense operation and the third voltage level.

At 721, the respective access lines of the plurality of access lines for a fourth subset of memory cells (e.g., unselected memory cells) of the string of series-connected memory cells might be discharged to the first voltage level. Each memory cell of the fourth subset of memory cells might be between the third subset of memory cells and the second end of the string of series-connected memory cells. As an example, the fourth subset of memory cells might be a plurality of the memory cells 208 between the third subset of memory cells and a dummy memory cell nearest the second end of the NAND string $206_0$, e.g., the memory cells $208_{n+3}$-$208_Y$ of the NAND string $206_0$ connected respectively to access lines $202_{n+3}$-$202_Y$. The fourth subset of memory cells might be a contiguous plurality of memory cells.

The discharging at 721 might begin at a time subsequent to a time when the discharging at 719 began. Alternatively, the discharging at 721 might begin at a same time when the discharging at 719 began. The discharging at 721 might further begin at a time prior to a time when the discharging at 719 reaches the third voltage level. The discharging at 721 might begin from a voltage level used for the sense operation, e.g., a pass voltage. Alternatively, the discharging at 721 might begin from an intermediate voltage level, such as a voltage level between the voltage level used for the sense operation and the third voltage level.

At 723, the respective access lines of the plurality of access lines for a fifth subset of memory cells (e.g., unselected edge dummy memory cells) of the string of series-connected memory cells might be discharged to the first voltage level. A first memory cell of the fifth subset of memory cells might be between the first subset of memory cells and the first end of the string of series-connected memory cells, e.g., one or more of the memory cells $208_{D0}$-$208_{D1}$ of the NAND string $206_0$ connected respectively to access lines $202_{D0}$-$202_{D1}$, and/or a second memory cell of the fifth subset of memory cells might be between the fourth subset of memory cells and the second end of the string of series-connected memory cells, e.g., one or more of the memory cells $208_{D2}$-$208_{D3}$ of the NAND string $206_0$ connected respectively to access lines $202_{D2}$-$202_{D3}$. For example, the fifth subset of memory cells might be each of the memory cells $208_{D0}$-$208_{D3}$ of the NAND string $206_0$ connected to access lines $202_{D0}$-$202_{D3}$. The fifth subset of memory cells might include more than one contiguous plurality of memory cells.

The discharging at 723 might begin at a time subsequent to a time when the discharging at 719 and/or 721 began. The discharging at 723 might further begin at a time prior to a time when the discharging at 719 reaches the third voltage level and/or at a time prior to a time when the discharging at 721 reaches the first voltage level. The discharging at 723 might begin from a voltage level used for the sense operation, e.g., a pass voltage. Alternatively, the discharging at 723 might begin from an intermediate voltage level, such as a voltage level between the voltage level used for the sense operation and the first voltage level.

At 725, a programming pulse might optionally be applied to the respective access line of the plurality of access lines for the particular memory cell without discharging the respective access line of the plurality of access lines for the particular memory cell to the first voltage level and without discharging the respective access line of the plurality of access lines for the third memory cell to the first voltage level. For example, prior to the subsequent programming pulse, the voltage level of the respective access line for the particular memory cell might be increased to the pass voltage directly from the second voltage level, while the voltage level of the respective access lines for the third subset of memory cells might be increased to the pass voltage directly from the third voltage level.

For some embodiments, additional access lines between the access lines corresponding to the third subset of memory cells and the access lines corresponding to the fourth subset of memory cells might be discharged to other voltage levels lower than the third voltage level and higher than the first voltage level. For some embodiments, such additional access lines might be discharged sequentially for each such lower voltage level. For example, after the discharging at 719, the respective access lines of the plurality of access lines for a sixth subset of memory cells (e.g., unselected memory cells) of the string of series-connected memory cells might be discharged to the fourth voltage level lower than the third voltage level and higher than the first voltage level. Each memory cell of the sixth subset of memory cells might be between the third subset of memory cells and the fourth subset of memory cells. Such discharging of the additional access lines (e.g., a last subset of additional access lines) might be discharged beginning at a same time as the discharging at 721. The various subsets of memory cells might be mutually exclusive, and may collectively, along with the particular memory cell, represent each memory cell of the string of series-connected memory cells.

Figure 8:
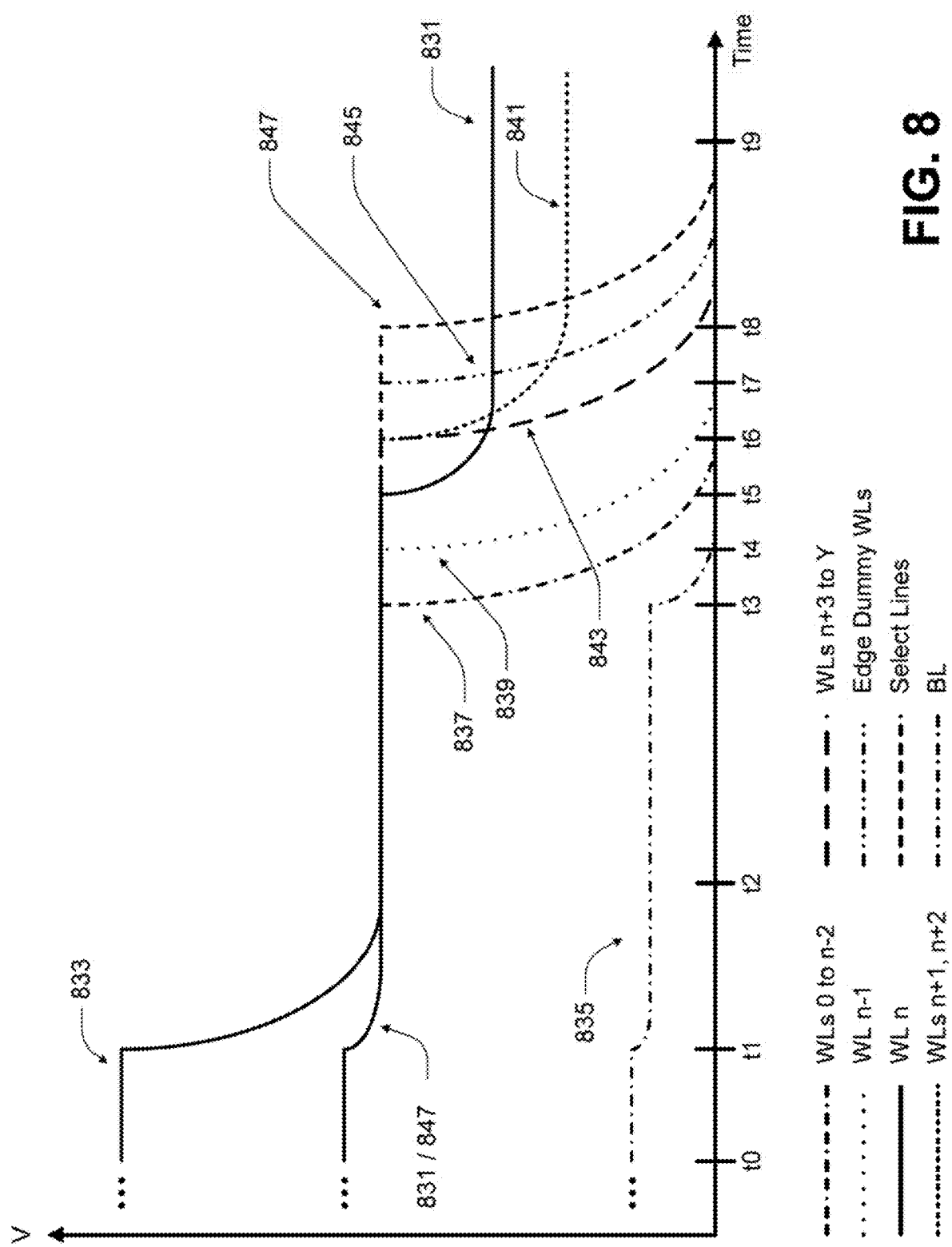
FIG. 8 depicts a timing diagram for a method of operating a memory in accordance with a further embodiment.

FIG. 8 depicts a timing diagram for a method of operating a memory in accordance with a further embodiment. For example, FIG. 8 might depict a timing diagram for a method as described with reference to FIGS. 7A-7B.

In FIG. 8, trace 831 might represent the voltage level applied to an access line 202 connected to a memory cell 208 selected for a prior sense operation or subsequent programming operation, e.g., a target memory cell. The following discussion will be made with reference to at least FIG. 3 and will presume that the target memory cell is the memory cell $208_n$ of the NAND string $206_0$, such that trace 831 might represent the voltage level applied to access line $202_n$. The access line $202_n$ may be referred to as the selected access line as it contains the target memory cell, while remaining access lines 202 may be referred to as unselected access lines. The NAND string $206_0$ may be referred to as the selected string of series-connected memory cells as it contains the target memory cell. The NAND string $206_1$ may be referred to as an unselected string of series-connected memory cells as it may contain no memory cell for which the sense operation is being performed. The NAND string $206_1$ might also contain a victim memory cell, e.g., the memory cell $208_n$ of the NAND string $206_1$.

Trace 833 might represent the voltage level applied to unselected access lines 202, e.g., access lines $202_{D0}$-$202_{D1}$, $202_0$-$202_{n-1}$, $202_{n+1}$-$202_Y$, and $202_{D2}$-$202_{D3}$. Trace 835 might represent the voltage level applied to a data line 204, e.g., the unselected data line $204_1$ selectively connected to the victim memory cell $208_n$ of the NAND string $206_1$. Trace 837 might represent the voltage level applied to unselected access lines $202_0$-$202_{n-2}$. Trace 839 might represent the voltage level applied to unselected access line $202_{n-1}$. Trace 841 might represent the voltage level applied to unselected access lines $202_{n+1}$ and $202_{n+2}$. Trace 843 might represent the voltage level applied to unselected access lines $202_{n+3}$-$202_Y$. Trace 845 might represent the voltage level applied to unselected access lines $202_{D0}$-$202_{D3}$. Trace 847 might represent the voltage level applied to select lines 214 and 215.

At time t0, trace 831 might have a voltage level corresponding to a program verify voltage used (e.g., last used) on the selected access line during a program verify operation, and corresponding to a voltage level applied to the select lines during the program verify operation, for example. As one example, the voltage level of trace 831 at time t0 might be 5V. Similarly, trace 833 might have a voltage level corresponding to a pass voltage used on the unselected access lines during the program verify operation, for example. As one example, the voltage level of trace 833 at time t0 might be 8V. In addition, trace 835 might have a voltage level corresponding to a voltage used on the data line during the program verify operation, for example. As one example, the voltage level of trace 835 at time t0 might be 1V.

At time t1, traces 831 and 833 might be discharged to an intermediate voltage level lower than the voltage level used during the program verify operation. The intermediate voltage level for trace 831 might be a same voltage level as the intermediate voltage level for trace 833. In addition, at time t1, trace 835 might be discharged to an intermediate voltage level.

At time t2, traces 831, 833 and 835 might have reached their respective intermediate voltage levels. As one example, the intermediate voltage level for traces 831 and 835 at time t2 might be 4.5V, and the intermediate voltage level for trace 835 might be 0.8V.

At time t3, trace 837 might be discharged to a first voltage level, e.g., a reference potential, which might be 0V or ground. Not that discharging of voltage levels is typically not instantaneous and may decay to its intended voltage level over some time period as depicted in FIG. 8. Trace 835 might be similarly discharged to the first voltage level. At time t4, trace 839 might be discharged to the reference potential. At time t5, trace 831 might be discharged to a second voltage level higher than the first voltage level. At time t6, trace 841 might be discharged to a third voltage level lower than the second voltage level and higher than the first voltage level. Also at time t6, trace 843 might be discharged to the first voltage level. At time t7, trace 845 might be discharged to the first voltage level. At time t8, trace 847 might be discharged to the first voltage level. At time t9, trace 831 might be at the second voltage level, trace 841 might be at the third voltage level, and remaining traces might be at the first voltage level. A subsequent programming pulse might then be applied without discharging traces 831 and 841 from their respective voltage levels, e.g., with trace 831 increasing to the pass voltage from the second voltage level, trace 841 increasing to the pass voltage level from the third voltage level, and remaining unselected access lines increasing to the pass voltage from the first voltage level.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of operating a memory, comprising:
performing a sense operation on a particular memory cell of a string of series-connected memory cells, wherein each memory cell of the string of series-connected memory cells is connected to a respective access line of a plurality of access lines;
discharging the respective access line of the plurality of access lines for a second memory cell of the string of series-connected memory cells to a first voltage level;
discharging the respective access line of the plurality of access lines for the particular memory cell to a second voltage level higher than the first voltage level; and
discharging the respective access line of the plurality of access lines for a third memory cell of the string of series-connected memory cells to a third voltage level lower than the second voltage level and higher than the first voltage level.

2. The method of claim 1, further comprising:
applying a programming pulse to the respective access line of the plurality of access lines for the particular memory cell without discharging the respective access line of the plurality of access lines for the particular memory cell to the first voltage level, and without discharging the respective access line of the plurality of access lines for the third memory cell to the first voltage level.

3. The method of claim 1, wherein the second memory cell is between the particular memory cell and one end of the string of series-connected memory cells, and wherein the third memory cell is between the particular memory cell and a different end of the string of series-connected memory cells.

4. The method of claim 3, wherein the different end of the string of series-connected memory cells is an end of the string of series-connected memory cells closest to a data line selectively connected to the string of series-connected memory cells.

5. The method of claim 3, further comprising:
discharging the respective access lines of the plurality of access lines for one or more additional memory cells between the particular memory cell and the one end of the string of series-connected memory cells to the first voltage level concurrently with discharging the respective access line of the plurality of access lines for the second memory cell.

6. The method of claim 5, wherein discharging the respective access lines of the plurality of access lines for the one or more additional memory cells between the particular memory cell and the one end of the string of series-connected memory cells concurrently with discharging the respective access line of the plurality of access lines for the second memory cell comprises discharging each access line of the plurality of access lines between the respective access line of the plurality of access lines for a fourth memory cell of the string of series-connected memory cells immediately adjacent the particular memory cell, and the respective access line of the plurality of access lines for an edge dummy memory cell of the string of series-connected memory cells.

7. The method of claim 3, wherein discharging the respective access line of the plurality of access lines for the third memory cell comprises discharging the respective access line of the plurality of access lines for a memory cell of the string of series-connected memory cells that is immediately adjacent the particular memory cell.

8. The method of claim 3, wherein discharging the respective access line of the plurality of access lines for the third memory cell comprises discharging the respective access lines of the plurality of access lines for a contiguous plurality of memory cells of the string of series-connected memory cells that is immediately adjacent the particular memory cell.

9. The method of claim 3, further comprising:
discharging the respective access line of the plurality of access lines for a fourth memory cell to a fourth voltage level lower than the third voltage level and higher than the first voltage level;
wherein the fourth memory cell is between the third memory cell and the different end of the string of series-connected memory cells.

10. The method of claim 1, wherein discharging the respective access line of the plurality of access lines for the particular memory cell, discharging the respective access line of the plurality of access lines for the second memory cell, and discharging the respective access line of the plurality of access lines for the third memory cell begin at a same time.

11. The method of claim 1, wherein discharging the respective access line of the plurality of access lines for the second memory cell to the first voltage level comprises discharging the respective access line of the plurality of access lines for the second memory cell to a reference potential.

12. A method of operating a memory, comprising:
performing a sense operation on a particular memory cell of a string of series-connected memory cells, wherein each memory cell of the string of series-connected memory cells is connected to a respective access line of a plurality of access lines;
discharging the respective access lines of the plurality of access lines for a first subset of memory cells of the string of series-connected memory cells to a first voltage level, wherein each memory cell of the first subset of memory cells is between the particular memory cell and a first end of the string of series-connected memory cells;
discharging the respective access lines of the plurality of access lines for a second subset of memory cells of the string of series-connected memory cells to the first voltage level, wherein each memory cell of the first subset of memory cells is between the particular memory cell and the first subset of memory cells;
discharging the respective access line of the plurality of access lines for the particular memory cell to a second voltage level higher than the first voltage level;
discharging the respective access lines of the plurality of access lines for a third subset of memory cells of the string of series-connected memory cells to a third voltage level lower than the second voltage level and higher than the first voltage level, wherein each memory cell of the third subset of memory cells is between the particular memory cell and a second end of the string of series-connected memory cells;
discharging the respective access lines of the plurality of access lines for a fourth subset of memory cells of the string of series-connected memory cells to the first voltage level, wherein each memory cell of the fourth subset of memory cells is between the third subset of memory cells and the second end of the string of series-connected memory cells; and
discharging the respective access lines of the plurality of access lines for a fifth subset of memory cells of the string of series-connected memory cells to the first voltage level, wherein at least one memory cell of the fifth subset of memory cells is in a position selected from a group consisting of between the first subset of memory cells and the first end of the string of series-connected memory cells, and between the fourth subset of memory cells and the second end of the string of series-connected memory cells.

13. The method of claim 12, wherein performing the sense operation comprises performing a program verify operation.

14. The method of claim 13, further comprising:
applying a programming pulse to the respective access line of the plurality of access lines for the particular memory cell without discharging the respective access line of the plurality of access lines for the particular memory cell to the first voltage level, and without discharging the respective access line of the plurality of access lines for the third memory cell to the first voltage level.

15. The method of claim 12, further comprising:
initiating discharging the respective access lines of the plurality of access lines for the first subset of memory cells after completion of the sense operation;
initiating discharging the respective access lines of the plurality of access lines for the second subset of memory cells after initiating discharging the respective access lines of the plurality of access lines for the first subset of memory cells;
initiating discharging the respective access line of the plurality of access lines for the particular memory cells after initiating discharging the respective access lines of the plurality of access lines for the second subset of memory cells;

initiating discharging the respective access lines of the plurality of access lines for the third subset of memory cells after initiating discharging the respective access line of the plurality of access lines for the particular memory cell;

initiating discharging the respective access lines of the plurality of access lines for the fourth subset of memory cells after initiating discharging the respective access line of the plurality of access lines for the particular memory cell; and initiating discharging the respective access lines of the plurality of access lines for the fifth subset of memory cells after initiating discharging the respective access lines of the plurality of access lines for the fourth subset of memory cells.

16. The method of claim 15, wherein initiating discharging the respective access lines of the plurality of access lines for the fourth subset of memory cells after initiating discharge of the respective access line of the plurality of access lines for the particular memory cell comprises initiating discharging the respective access lines of the plurality of access lines for the fourth subset of memory cells at a same time as initiating discharging the respective access lines of the plurality of access lines for the third subset of memory cells.

17. The method of claim 12, wherein discharging the respective access lines of the plurality of access lines for the first subset of memory cells to the first voltage level comprises discharging the respective access lines of the plurality of access lines for the first subset of memory cells to a reference potential.

18. The method of claim 17, further comprising discharging the respective access line of the plurality of access lines for the particular memory cell to the second voltage level higher than an average of a program verify voltage for the sense operation and the reference potential.

19. The method of claim 18, further comprising discharging the respective access lines of the plurality of access lines for the third subset of memory cells to the third voltage level lower than the average of the program verify voltage for the sense operation and the reference potential.

20. A memory, comprising:
an array of memory cells comprising a plurality of strings of series-connected memory cells; and
a controller for access of the array of memory cells, wherein the controller is configured to:
  perform a sense operation on a particular memory cell of a string of series-connected memory cells of the plurality of strings of series-connected memory cells, wherein each memory cell of the string of series-connected memory cells is connected to a respective access line of a plurality of access lines;
  discharge the respective access line of the plurality of access lines for a second memory cell of the string of series-connected memory cells to a first voltage level, wherein the second memory cell is between the particular memory cell and a first end of the string of series-connected memory cells;
  discharge the respective access line of the plurality of access lines for the particular memory cell to a second voltage level higher than the first voltage level; and
  discharge the respective access line of the plurality of access lines for a third memory cell of the string of series-connected memory cells to a third voltage level lower than the second voltage level and higher than the first voltage level, wherein the third memory cell is between the particular memory cell and a second end of the string of series-connected memory cells.

21. The memory of claim 20, wherein the array of memory cells is a three-dimensional NAND array.

22. The memory of claim 20, wherein the controller is further configured to:
apply a fourth voltage level higher than the second voltage level to each access line of the plurality of access lines other than the respective access line of the plurality of access lines for the particular memory cell during the sense operation;
apply a fifth voltage level higher than the second voltage level and lower than the fourth voltage level to the respective access line of the plurality of access lines for the particular memory cell during the sense operation; and
discharge each access line of the plurality of access lines to a sixth voltage level lower than the fifth voltage level and higher than the second voltage level prior to discharging the respective access line of the plurality of access lines for the second memory cell of the string of series-connected memory cells to the first voltage level.

23. A memory, comprising:
an array of memory cells comprising a plurality of strings of series-connected memory cells; and
a controller for access of the array of memory cells, wherein the controller is configured to:
  perform a sense operation on a particular memory cell of a string of series-connected memory cells of the plurality of strings of series-connected memory cells, wherein each memory cell of the string of series-connected memory cells is connected to a respective access line of a plurality of access lines;
  discharge the respective access lines of the plurality of access lines for a first subset of memory cells of the string of series-connected memory cells to a first voltage level, wherein each memory cell of the first subset of memory cells is between the particular memory cell and a first end of the string of series-connected memory cells;
  discharge the respective access lines of the plurality of access lines for a second subset of memory cells of the string of series-connected memory cells to the first voltage level, wherein each memory cell of the first subset of memory cells is between the particular memory cell and the first subset of memory cells;
  discharge the respective access line of the plurality of access lines for the particular memory cell to a second voltage level higher than the first voltage level;
  discharge the respective access lines of the plurality of access lines for a third subset of memory cells of the string of series-connected memory cells to a third voltage level lower than the second voltage level and higher than the first voltage level, wherein each memory cell of the third subset of memory cells is between the particular memory cell and a second end of the string of series-connected memory cells;
  discharge the respective access lines of the plurality of access lines for a fourth subset of memory cells of the string of series-connected memory cells to the first voltage level, wherein each memory cell of the fourth subset of memory cells is between the third subset of memory cells and the second end of the string of series-connected memory cells; and discharge the respective access lines of the plurality of access lines for a fifth subset of memory cells of the string of series-connected memory cells to the first voltage level, wherein at least one memory cell of the fifth subset of memory cells is in a position selected from a group consisting of between the first subset of memory cells and the first end of the string of series-connected memory cells, and between the fourth subset of memory cells and the second end of the string of series-connected memory cells.

24. The memory of claim 23, wherein the first subset of memory cells comprises a contiguous plurality of memory cells, wherein the third subset of memory cells comprises a contiguous plurality of memory cells, wherein the fourth subset of memory cells comprises a contiguous plurality of memory cells, wherein the fifth subset of memory cells comprises more than one contiguous plurality of memory cells; and wherein the particular memory cell, the first subset of memory cells, the second subset of memory cells, the third subset of memory cells, the fourth subset of memory cells and the fifty subset of memory cells are each mutually exclusive, and collectively include each memory cell of the string of series-connected memory cells.

25. The memory of claim 23, wherein the fifth subset of memory cells comprises edge dummy memory cells.

* * * * *